(12) United States Patent
Krishnapura et al.

(10) Patent No.: US 9,456,521 B2
(45) Date of Patent: Sep. 27, 2016

(54) CEILING OR FLOOR SPACE MOUNTABLE HEAT CONTROL SYSTEM USING NETWORK COMPUTING DEVICES

(75) Inventors: Sheshaprasad G. Krishnapura, Mountain View, CA (US); Vipul Lal, Santa Clara, CA (US); Ty H. Tang, San Francisco, CA (US)

(73) Assignee: INTEL CORPORATION, Santa Clara, CA (US)

( * ) Notice: Subject to any disclaimer, the term of this patent is extended or adjusted under 35 U.S.C. 154(b) by 567 days.

(21) Appl. No.: 13/586,278

(22) Filed: Aug. 15, 2012

(65) Prior Publication Data

US 2014/0052276 A1   Feb. 20, 2014

(51) Int. Cl.
| | |
|---|---|
| G05D 23/00 | (2006.01) |
| G05B 15/02 | (2006.01) |
| G05D 7/00 | (2006.01) |
| H05K 7/14 | (2006.01) |
| G05D 23/19 | (2006.01) |
| H05K 7/20 | (2006.01) |

(52) U.S. Cl.
CPC ........ *H05K 7/1497* (2013.01); *G05D 23/1931* (2013.01); *H05K 7/20745* (2013.01); *H05K 7/20836* (2013.01)

(58) Field of Classification Search
None
See application file for complete search history.

(56) References Cited

U.S. PATENT DOCUMENTS

| | | | | |
|---|---|---|---|---|
| 6,881,142 | B1 * | 4/2005 | Nair | 454/186 |
| 2003/0216837 | A1 * | 11/2003 | Reich et al. | 700/276 |
| 2007/0081549 | A1 * | 4/2007 | Cicchetti et al. | 370/447 |
| 2008/0049393 | A1 * | 2/2008 | Coglitore | G06F 1/18 361/679.45 |
| 2011/0096503 | A1 * | 4/2011 | Avery | F25B 27/02 361/701 |
| 2012/0218707 | A1 * | 8/2012 | Chan | 361/679.48 |
| 2014/0029196 | A1 * | 1/2014 | Smith | G05D 23/1934 361/679.53 |

* cited by examiner

*Primary Examiner* — Mohammad Ali
*Assistant Examiner* — Bernard G Lindsay

(57) ABSTRACT

Examples are disclosed for operating, managing or controlling one or more network computing devices housed in a chassis capable of being mounting in a ceiling space or a floor space for a room. Operating, managing or controlling may include adjusting one or more fans to direct airflow either away or towards the room or powering a light emitting diode array attached with the chassis to provide lighting to the room. Examples are also disclosed for using an aggregator to operate, manage or control an array of network computing devices separately housed in chassis capable of being mounted in a ceiling space or floor space for one or more rooms.

20 Claims, 9 Drawing Sheets

600

- RECEIVE SENSOR INFORMATION FROM ONE OR MORE SENSORS LOCATED WITH A NETWORK COMPUTING DEVICE HOUSED IN A CHASSIS
  602

- ADJUST ONE OR MORE FANS HOUSED IN THE CHASSIS BASED ON THE RECEIVED SENSOR INFORMATION, THE ONE OR MORE FANS ADJUSTED TO PROVIDE AIRFLOW IN A FIRST DIRECTION TOWARDS AN AREA ABOVE THE CHASSIS OR IN A SECOND DIRECTION AWAY FROM THE AREA ABOVE THE CHASSIS
  604
  - SENSOR INFORMATION INCLUDES A COMPARISON OF A FIRST TEMPERATURE FOR THE AREA ABOVE THE CHASSIS TO A SECOND TEMPERATURE FOR THE AREA BELOW THE CHASSIS, THE ONE OR MORE FANS ADJUSTED TO PROVIDE AIRFLOW IN THE SECOND DIRECTION BASED ON THE COMPARISON INDICATING THE FIRST TEMPERATURE IS LOWER THAN THE SECOND TEMPERATURE
    606

- PROVIDE POWER TO AN LED ARRAY BASED ON THE RECEIVED SENSOR INFORMATION
  608
  - SENSOR INFORMATION INCLUDES MOTION SENSOR INFORMATION OR LIGHT SENSOR INFORMATION, POWER PROVIDED BASED ON INDICATIONS OF MOVEMENT IN THE ROOM OR AMBIENT LIGHT IN THE ROOM BELOW A THRESHOLD LEVEL
    610

- COUPLE AN ARRAY OF NETWORK COMPUTING DEVICES SEPARATELY HOUSED IN CHASSISES MOUNTED IN A CEILING SPACE OR A FLOOR SPACE FOR ONE OR MORE ROOMS
  - COUPLE BY USING AN AGGREGATOR TO ROUTE SEPARATE COMMUNICATION LINKS BETWEEN THE AGGREGATOR AND EACH NETWORK COMPUTING DEVICE
    704
  702

- MANAGE THE ARRAY OF NETWORK COMPUTING DEVICES THROUGH THE AGGREGATOR
  706
  - USE A MANAGER COMPUTING DEVICE CAPABLE OF INCLUDING A USER-INTERFACE TO ENABLE A USER TO MANAGE OR CONTROL ONE OR MORE OPERATIONS OF THE AGGREGATOR OR THE ARRAY OF NETWORK COMPUTING DEVICES
    708

*FIG. 7*

CEILING OR FLOOR SPACE MOUNTABLE HEAT CONTROL SYSTEM USING NETWORK COMPUTING DEVICES

BACKGROUND

Network computing devices such as servers may come in two types of form factors. A rack-mountable form factor may be one type that includes one or more servers mounted in a single enclosure. Multiple enclosures including these rack-mountable servers may be co-located in a server farm or data center and usually require specialized cooling systems to remove generated heat. Another type of form factor may be tower or pedestal style server enclosures. Tower server enclosures may be free standing and most designs are not stackable. Tower server enclosures may typically include fans to remove generated heat. Rack-mountable servers may utilize space more efficiently but specialized cooling systems can be expensive. Tower server enclosures may not require expensive, specialized cooling systems but potentially valuable building space may be needed for these free standing enclosures.

BRIEF DESCRIPTION OF THE DRAWINGS

FIG. 6 illustrates an example logic flow for receiving sensor information.
FIG. 7 illustrates an example flow diagram for coupling an array of network computing devices.

DETAILED DESCRIPTION

As contemplated in the present disclosure, rack-mountable servers may require expensive, specialized cooling systems and tower server enclosures may consume potentially valuable building space. Efforts are needed to more efficiently utilize building space when deploying servers and yet do so in a manner that does not require expensive cooling systems. One possible solution is to disperse servers or network computing devices in a decentralized manner that reduces or eliminates the need for specialized cooling. However, dispersal using tower enclosures in a decentralized deployment still uses valuable building space. Further, decentralized network computing devices may also lead to added asset tracking and manageability costs due to a lack of consistent, modular or integrated server management techniques. It is with respect to these and other challenges that the examples described herein are needed.

In some examples, techniques are implemented for a ceiling space or floor space mountable network computing device. For these examples, sensor information may be received from one or more sensors located with the network computing device. The network computing device may be housed in a chassis (e.g., mounted in a ceiling space or a floor space of a room). One or more fans housed in the chassis may be adjusted based on the received sensor information. The one or more fans may be adjusted to provide airflow in a first direction towards an area above the chassis or in a second direction away from the area above the chassis. The first direction may be towards an attic above the ceiling space if the chassis is mounted in a ceiling space or may be towards the room above the floor space if the chassis is mounted in a floor space. Also, the second direction may be towards the room below the ceiling space if the chassis is mounted in the ceiling space or away from the room (e.g., towards a crawl space) if the chassis is mounted in the floor space.

According to some examples, other techniques are implemented for the ceiling space or floor space mountable network computing device. For these examples, an array of network computing devices separately housed in chassises mounted in a ceiling space or a floor space for one or more rooms may be coupled using an aggregator to route separate communication links between the aggregator and each network computing device of the array. The array of network computing devices may then be managed through the aggregator using a manager computing device capable of including a user-interface to enable a user to manage or control one or more operations of the aggregator or the array of network computing devices.

Figure 1:
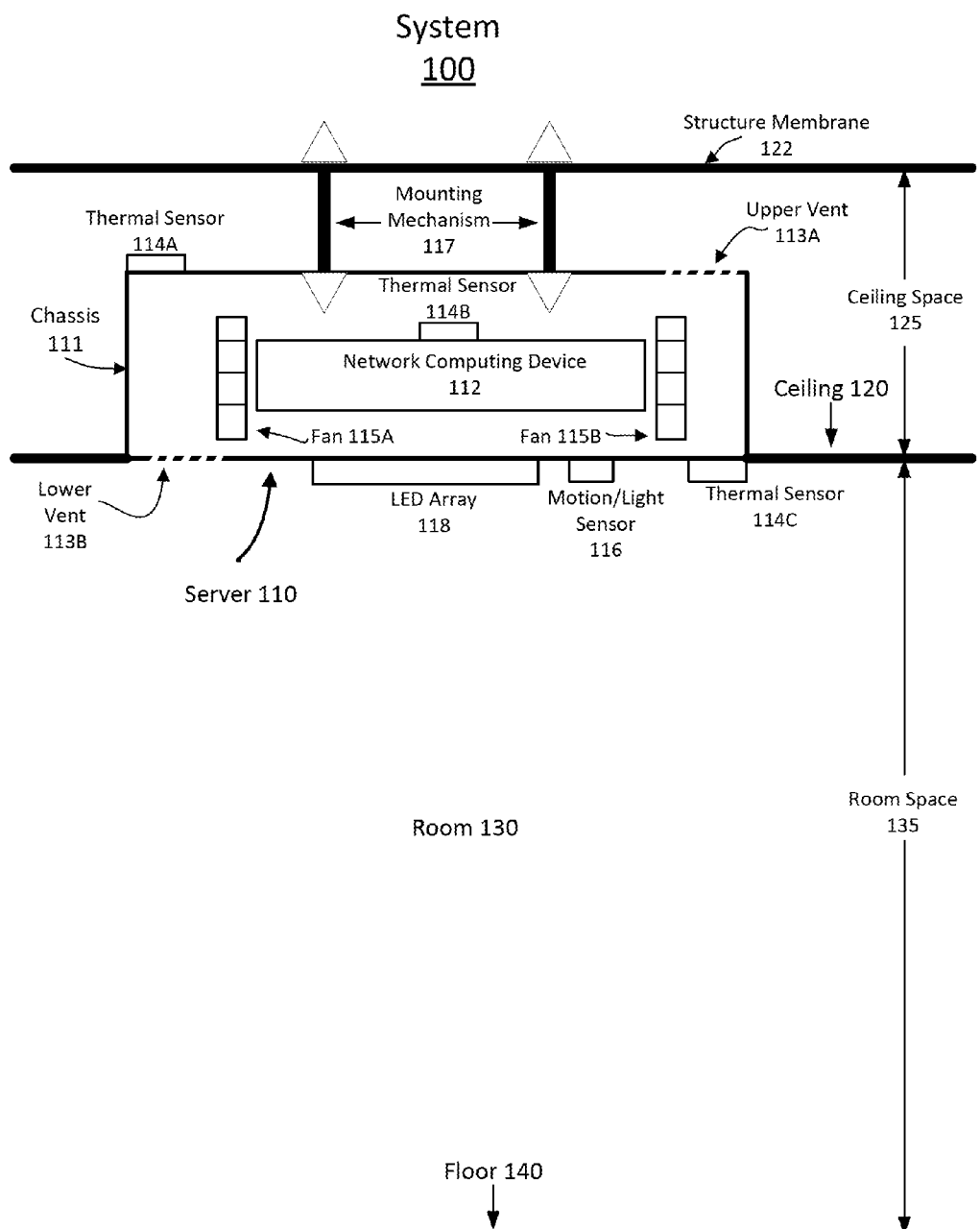
FIG. 1 illustrates an example first system.

FIG. 1 illustrates an example first system. In some examples, as shown in FIG. 1, the example first system includes system 100. As shown in FIG. 1, system 100 includes a server 110, a ceiling 120, a room 130 and a floor 140. Also as shown in FIG. 1, a ceiling space 125 is shown between ceiling 120 and structure membrane 122 and a room space 135 is shown between ceiling 120 and floor 140. Although not shown in FIG. 1, in some examples, server 110 may also be mounted in a floor space below room 130.

According to some examples, as shown in FIG. 1, server 110 may include a chassis 111, a network computing device 112, an upper vent 113A, a lower vent 113B, thermal sensors 114A-C, fans 115A-B, a motion/light sensor 116, a mounting mechanism 117 or a light emitting diode (LED) array 118. As shown in FIG. 1, at least some elements of server 110 may be arranged on a lower portion of chassis 111. For example, lower vent 113B, motion/light sensor 116, thermal sensor 114C and LED array 118 may be arranged such that these elements protrude at least partially into room space 135 when server 110 is mounted to structure membrane 122 via mounting mechanism 117. Also, network computing device 112, upper vent 113A, thermal sensors 114A-B and fans 115A-B may be in a portion of chassis 111 that is mostly within ceiling space 125.

In some examples, network computing device 112 may be deployed as part of an array of network computing devices. The array of network computing devices may provide individual or distributed computing resources as part of a server farm, data center, software as a service provider, cloud computing support infrastructure, grid computing, utility computing, etc. According to some examples, as described more below, the array of network computing devices may be mounted in a ceiling space such as ceiling space 125 and/or mounted in a floor space below floor 140. The ceiling/floor space may be above/below one or more rooms. In some aspects, the array of network computing devices may function as a virtual rack of servers in order to provide individual or distributed computing resources over a network.

In some examples, chassis 111 may be capable of channeling (e.g., via one or more air ducts—not shown) airflow provided by fan 115A and/or fan 115B to remove heat generated by network computing device 112. For these examples, server 110 may include logic and/or features capable of receiving sensor information from thermal sensors 114A, 114B or 114C. Based on the received sensor information, fan 115A and/or fan 115B may be adjusted to provide airflow in a first direction towards an area above chassis 111 or in a second direction towards an area below chassis 111. For example, the first direction may include a provided airflow that comes into chassis 111 through lower vent 113B and then out through upper vent 113A. The second direction may include a provided airflow that comes into chassis 111 through upper vent 113A and then out through lower vent 113B.

According to some examples, sensor information received from thermal sensor 114A may indicate a first temperature associated an area above chassis 111 (e.g., ceiling space 125). Sensor information received from thermal sensor 114C may indicate a second temperature associated with an area below chassis 111 (e.g., room space 135). Sensor information received from thermal sensor 114B may indicate a third temperature associated network computing device 112 or one or more components of networking computing device 112 (e.g., a processing unit or processor circuit). For these examples, the third temperature provided by thermal sensor 114B may indicate when an airflow may be needed to expel heat from chassis 111. Received sensor information may also include a comparison of the first temperature provided by thermal sensor 114A to the second temperature provided by thermal sensor 114C. For example, if the first temperature is lower than the second temperature this indicates that area above chassis 111 may be cooler than the area below chassis 111. Based on a determination of the area above chassis 111 being cooler than the area below chassis 111, fan 115A and/or fan 115B may be adjusted to provide airflow through chassis 111 in the first direction towards the area above chassis 111 as mentioned above. In another example, if the first temperature is higher than the second temperature this indicates that the area above chassis 111 may be warmer than the area below chassis 111. Based on a determination of the area above chassis 111 being warmer than the area below chassis 111, fan 115A and/or fan 115B may be adjusted to provide airflow through chassis 111 in the second direction away from the area above chassis 111 as mentioned above.

In some examples, server 110 may include logic, features or elements (not shown) to provide power to LED array 118 based on received sensor information. For these examples, LED array 118 may be capable of providing or augmenting lighting to room 130 once power is provided. The received sensor information may be received from motion/light sensor 116 and may include indications of movement in room 130 or indications that an ambient light level in room 130 has fallen below a threshold light level. The threshold light level may account for light levels adequate for a worker to perform work functions in room 130 or to provide security lighting to monitor room 130 (e.g., via a surveillance cameras).

According to some examples, server 110 may also include logic, features or elements to provide power to LED array 118 based on received sensor information or based on a given time of day associated with a 24-hour clock or cycle. For example, server 110 may be capable of providing power to LED array 118 based on typical work periods such as 7 a.m. to 5 p.m.

Figure 2A:
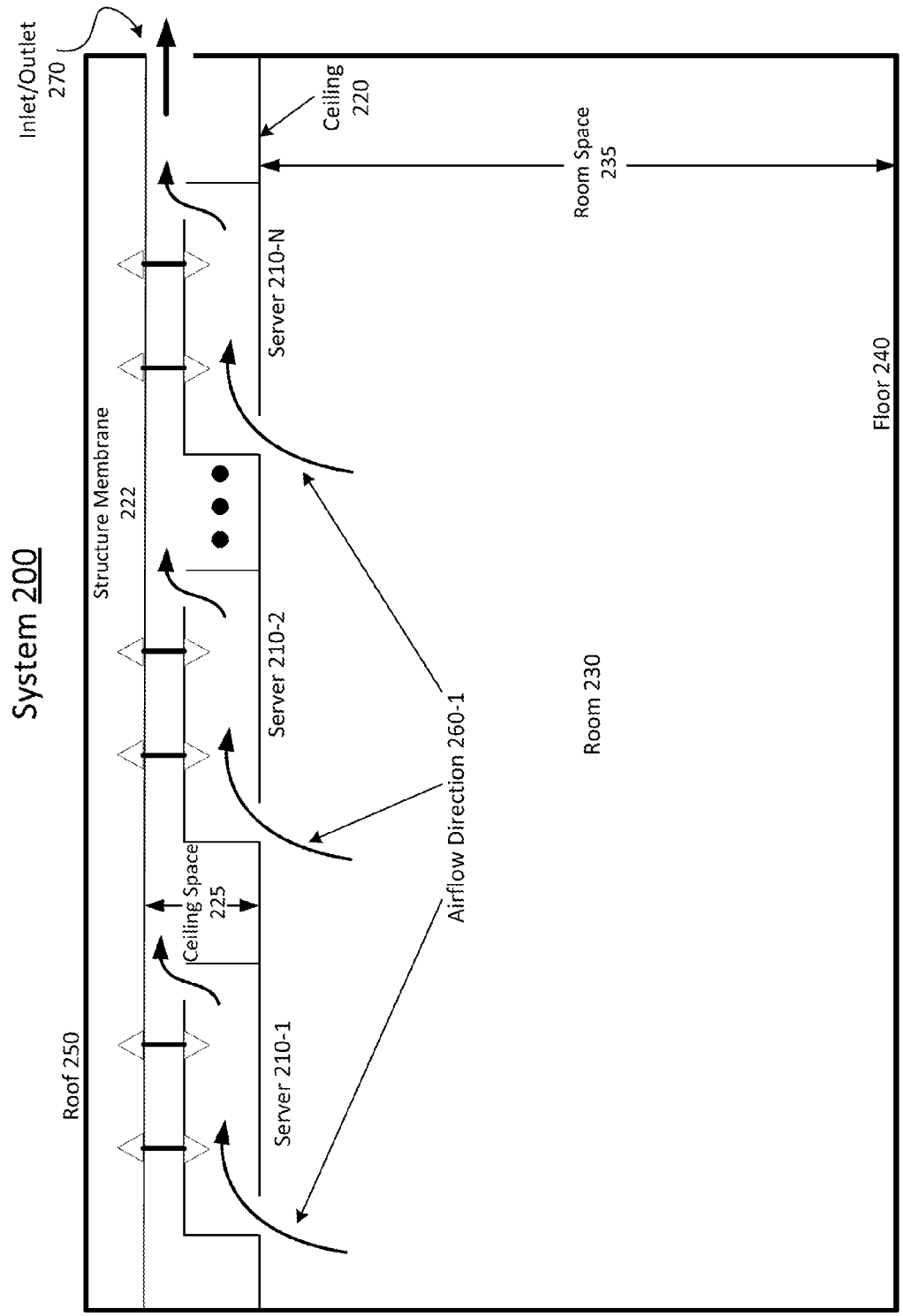
FIGS. 2A-B illustrate an example second system.
Figure 2B:
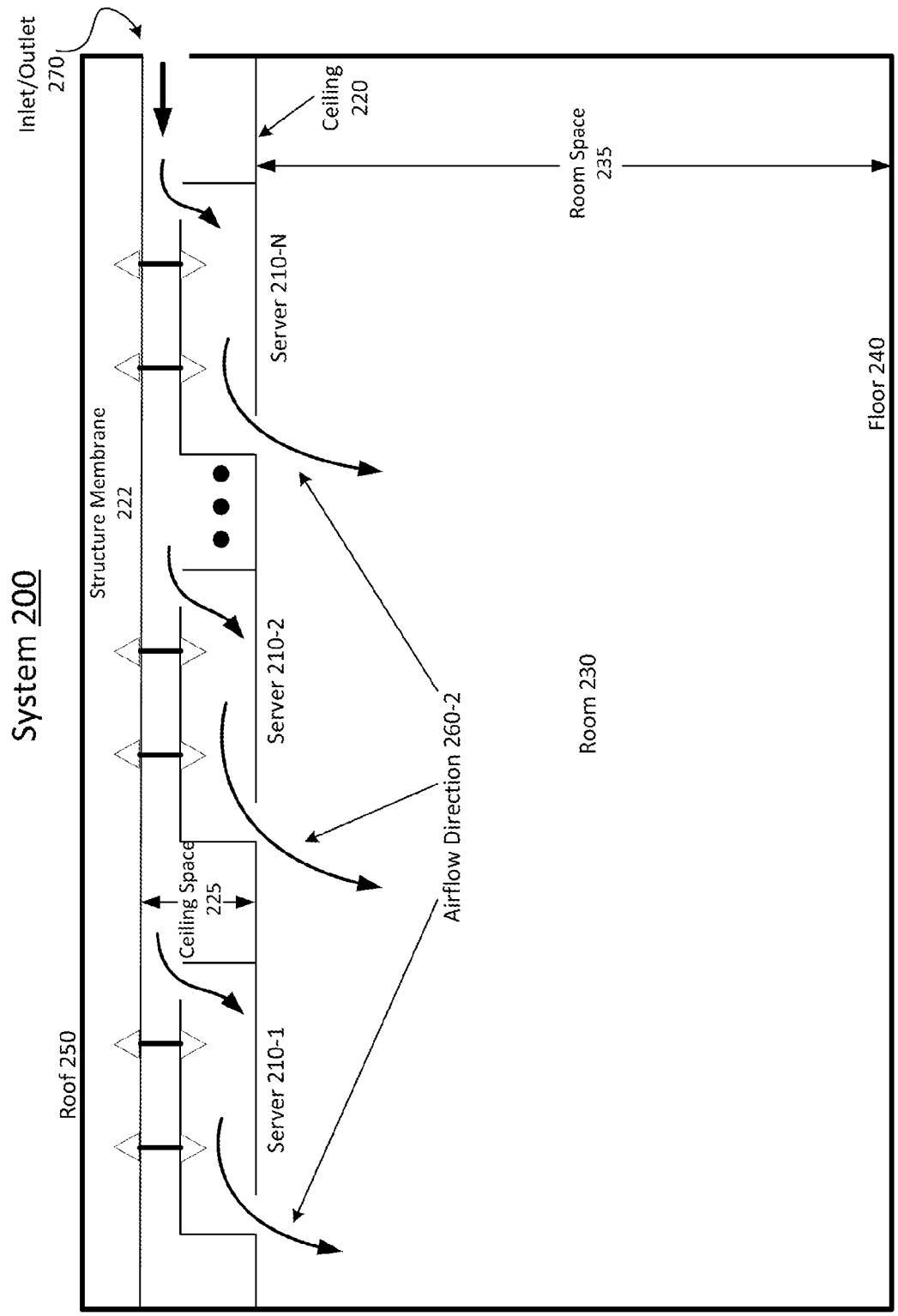

FIGS. 2A-B illustrate an example second system. In some examples, as shown in FIGS. 2A-B, the second system includes system 200. As shown in FIGS. 2A-B, system 200 includes servers 210-1 to 210-N (where N is any positive whole integer>2). In some examples, as shown in FIG. 2, servers 210-1 to 210-N may be separately mounted to a structure membrane 222 in a ceiling space 225 for a ceiling 220 above a room 230 and a floor 240. Also, an inlet/outlet 270 is shown between structure membrane 222 and a roof 250. According to some examples, the area between ceiling 220 and roof 250 may be at least a portion of an attic space for a building structure including one or more rooms such as room 230 and inlet/outlet 270 may provide an inlet/outlet for the attic. Cooler air from outside of the building structure may come into ceiling space 225 via inlet/outlet 270. Alternatively, warmer air may be pushed out of inlet/outlet 270 from ceiling space 225.

Although not shown in FIGS. 2A-B, in some examples, servers 210-1 to 210-N may also be mounted in a floor space below floor 240. For these examples, an inlet/outlet similar to inlet/outlet 270 may be located with the floor space below floor 240 to provide an inlet/outlet for the floor space. So similar to above, cooler air from outside of the building structure may come into the floor space via this inlet/outlet or warmer air may be pushed out of this inlet/outlet.

In some examples, as shown in FIG. 2A, airflow direction 260-1 may indicate airflow movement away from room 230. For these examples, servers 210-1 to 210-N may include similar elements or components as mentioned above for server 110 in FIG. 1. These components may include thermal sensors to provide sensor information that causes logic and/or features of servers 210-1 to 210-N to adjust fans for these servers in order to cause airflow direction 260-1 as shown in FIG. 2A. The sensor information may indicate that room space 235 is cooler that ceiling space 225. The cooler air pulled from room 230 may then be channeled to flow through servers 210-1 to 210-N. The air channeled to flow through servers 210-1 to 210-N may become heated (e.g., by an operating network computing device) and this heated air may then flow out of ceiling space 225 via inlet/outlet 270.

According to some examples, as shown in FIG. 2B, airflow direction 260-2 may indicate airflow movement toward room 230. For these examples, thermal sensors located with servers 210-1 to 210-N may provide sensor information that causes logic and/or features of servers 210-1 to 210-N to adjust fans for these servers in order to cause airflow direction 260-2 as shown in FIG. 2B. The sensor information may indicate that ceiling space 225 is cooler than room space 235. In some examples, the cooler air of ceiling space 225 may then be channeled to flow into through servers 210-1 to 210-N. The air channeled to flow through servers 210-1 to 210-N may become heated (e.g., by an operating network computing device) and this heated air may then flow into room 230. The pulling of the cooler air of ceiling space 225 towards room space 235 may also cause possibly cooler outside air to be pulled into ceiling space 225 via inlet/outlet 270.

In some examples, heated air directed into room 230 as described above for FIG. 2B may be used to at least augment heating for room 230. For these examples, room 230 may be an office space occupied by workers. The building may be geographically located in an area having relatively cooler outside temperatures. Cool air brought into ceiling space 225 via inlet/outlet 270 may be heated as mentioned above. The heated air may then be used to at least augment workspace heating to provide a comfortable work environment.

Figure 3:
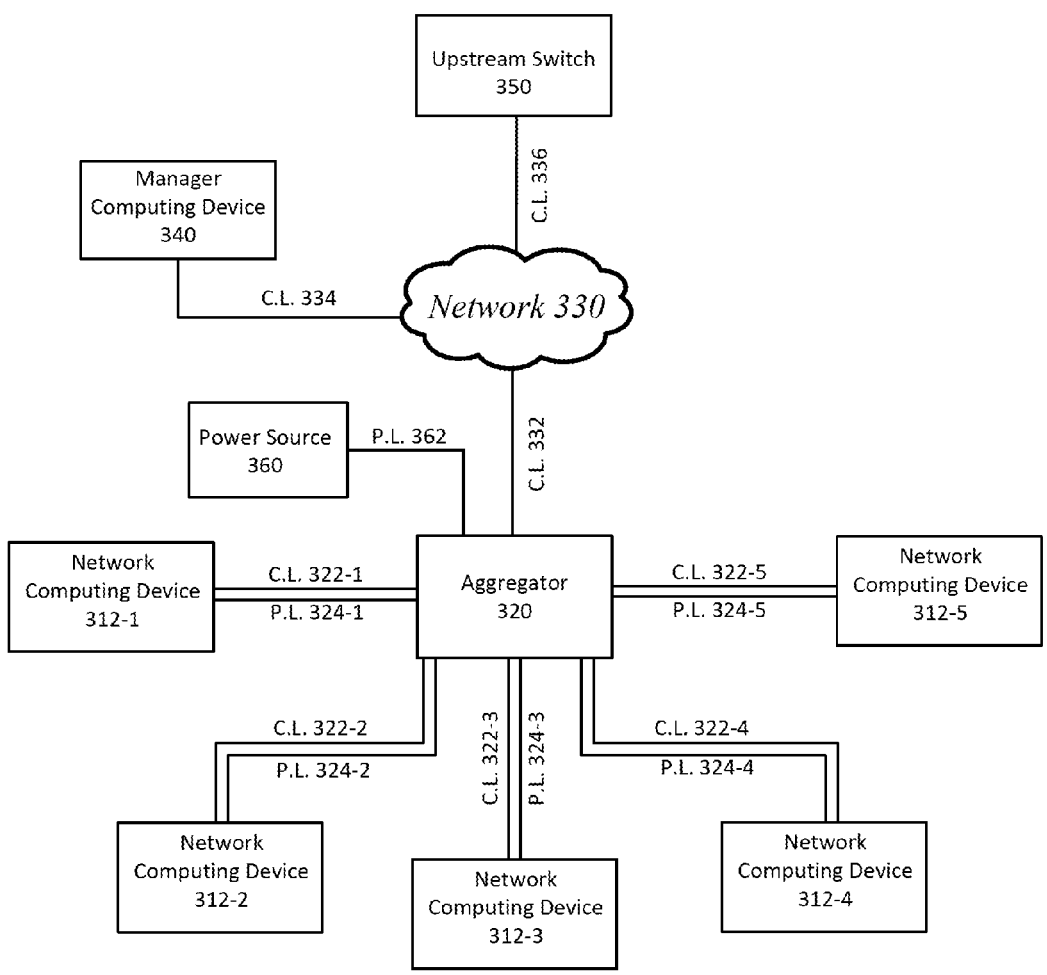
FIG. 3 illustrates an example third system.

FIG. 3 illustrates an example third system. In some examples, as shown in FIG. 3, the third system includes system 300. As shown in FIG. 3, system 300 includes network computing devices 312-1 to 312-5, an aggregator 320, a network 330, a manager computing device 340 and an upstream switch 350.

According to some examples, as shown in FIG. 3, aggregator 320 may couple to a power source 360 via power link (P.L.) 362 and couple to network computing devices 312-1 to 312-5 via separate communication links (C.L.s) 322-1 to 322-5, respectively. Aggregator 320 may also couple to network computing devices 312-1 to 312-5 via separate P.L.s 324-1 to 324-5, respectively. Also, as shown in FIG. 3, aggregator 320, manager computing device 340 and upstream switch 350 may couple to network 330 via C.L.s 332, 334 and 336, respectively.

In some examples, network 330 may be configured or arranged to operate as a type of closed network or intranet that allows aggregator 320, manager computing device 340 and upstream switch 350 to exchange network data traffic to include data and/or instructions. For these examples, network 330 and C.L.s 332, 334 or 335 may be operated according to one or more communication standards or protocols such as those associated with progenies and/or variants of Institute of Electrical and Electronics Engineers (IEEE) 802.3-2008, Carrier sense Multiple access with Collision Detection (CSMA/CD) Access Method and Physical Layer Specifications, Published in December 2008 (hereinafter "the Ethernet standard"). Also, for these examples, manager computing device 340 and/or upstream switch 350 may be located remote to a physical location of aggregator 320 (e.g., in a different building or geographic location). Alternatively, manager computing device 340 and/or upstream switch 350 may be located in a same building or geographic location in relation to a physical location of aggregator 320.

According to some examples, upstream switch 350 may serve as an attachment point for data processed or to be processed by network computing devices 312-1 to 312-5. For these examples, upstream switch 350 may be capable of operating according to the Ethernet standard and may couple to a larger network such as the Internet, a wide area network (WAN), a metropolitan area network (MAN) or a campus area network (CAN). This disclosure is not limited to these types of larger networks. Data processed by one or more of network computing devices 312-1 to 312-5 may be aggregated by aggregator 320 and then forwarded through C.L. 332 to network 330 and then through C.L. 336 to reach upstream switch 350. For other examples, data destined for and/or to be processed by one or more of network computing devices 312-1 to 312-5 may be forwarded from upstream switch 350 via C.L. 336 to network 330 and then through C.L. 332 to reach aggregator 320. For these other examples, aggregator 320 may then forward data destined for a given network computing device to that given network computing device.

In some examples, as mentioned above, separate P.L.s 324-1 to 324-5 may be coupled between network computing devices 312-1 to 312-5 and aggregator 320. For these examples, P.L.s 324-1 to 324-5 may be capable of providing full operational power to network computing devices 312-1 to 312-5 through aggregator 320.

In some examples, although not shown in FIG. 3, network computing devices 312-1 to 312-5 may be separately housed in chassises mounted in a ceiling space or a floor space for one or more rooms. These chassises may be capable of being mounted as described above for server 110 for FIG. 1. The chassises separately housing network computing devices 312-1 to 312-5 may include similar elements as server 110 to include, but not limited to fans, sensors, LED arrays and vents. According to some examples, power provided via P.L.s 324-1 to 324-5 may also power these similar elements.

According to some examples, communications routed through or to aggregator 320 may enable manager computing device 340 to manage network computing devices 312-1 to 312-5 through aggregator 320. For these examples, manager computing device 340 may include a user-interface (e.g., a keyboard/display or touch screen—not shown) to enable a user to manage or control one or more operations of aggregator 320 or the array of network computing device 312-1 to 312-5. As described more below, a user may initiate query or action commands to manage or control the one or more operations. The query or action commands, for example, may be forwarded via C.L. 334 to network 330 and then forwarded to aggregator 320 via C.L. 332.

According to some alternative examples, other power links may provide at least some or all operational power to network computing devices 312-1 to 312-5. For these alternative examples, aggregator 320 may provide none or at least a portion of the operational power via P.L.s 324-1 to 324-5.

In some examples, C.L.s 322-1 to 322-5 may be routed from aggregator 320 to their respective network computing devices 312-1 to 312-5 via cables separate from P.L.s 324-1 to 324-5. For these examples, the separate cables may be various types that may include, but is not limited to Fast Ethernet type cables (e.g., 100Base-T, 100Base-TX, 100Base-T4, 100Base-T2, 100Base-FX, 100Base-SX, 100BaseBX, and so forth), Gigabit Ethernet (GbE) type cables (e.g., 1000Base-T, 1000Base-SX, 1000Base-LX, 1000Base-BX10, 1000Base-CX, 1000Base-ZX, and so forth), 10 GbE type cables (e.g., 10GBase-SR, 10GBase-LRM, 10GBase-LR, 10GBase-ER, 10GBase-ZR, 10GBase-LX4, 10GBase-CX4, 10GBase-Kx, 10GBase-T, and so forth) or 100 GbE type cables. Aggregator 320 and network computing devices 312-1 to 312-5 may also include relevant communication interfaces to support the above-mentioned types of cables.

In some examples, both C.L.s 322-1 to 322-5 and P.L.s 324-1 to 324-5 may be routed from aggregator 320 to their respective network computing devices 312-1 to 312-5 via a single cable. For example, the single cable may operate according one or more technologies such as Power over Ethernet or Ethernet over Power lines. A power source within aggregator 320 and/or accessible to aggregator 320 may be capable of providing enough power via a power link portion within the single cable. A switch source within aggregator 320 may also be capable of routing data via a communication link portion of the single cable. The single cable using PoE may be configured or arranged to operate according to IEEE 802.3 at-2009, Power over Ethernet Plus Standard, published in September 2009 ("PoE+" or "PoE plus") and/or progenies or variants of this PoE+ standard. The single cable using Ethernet or Power lines may be configured or arranged to operate according IEEE 1901-2010, IEEE Standard for Broadband over Power Line Networks: Medium Access Control and Physical Layer Specifications, published in December, 2010 ("IEEE 1901") This disclosure is not limited to only the PoE+ standard or the IEEE 1901-2010 specification for a routing and/or configuring power and communication links through a single cable.

Figure 4:
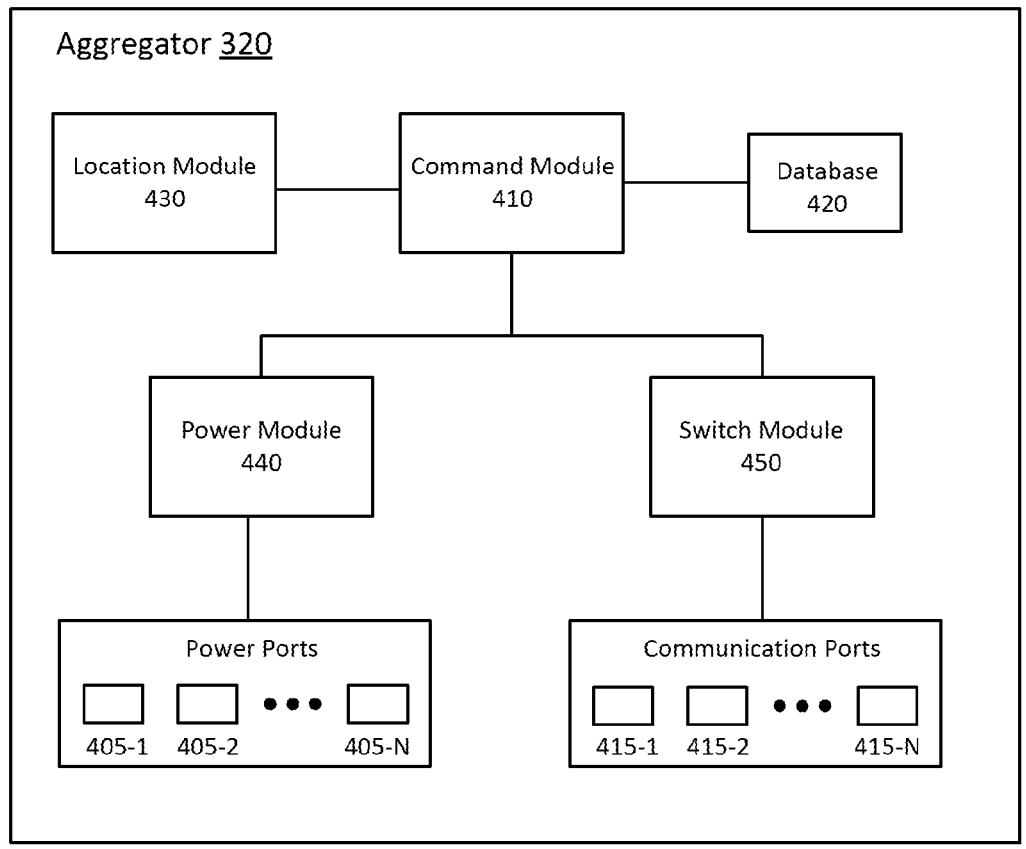
FIG. 4 illustrates a block diagram of an example aggregator.

FIG. 4 illustrates a block diagram of an example aggregator 320. In some examples, aggregator 320 includes features and/or logic configured or arranged to couple to an array of network computing devices and/or communicate with a managing computing device. As shown in FIG. 4, aggregator 320 includes power ports 405-1 to 405-N, communication ports 415-1 to 415-N, a command module 410, a database 420, a location module 430, a power module 440 or a switch module 450.

According to some examples, the elements portrayed in FIG. 4 are configured to support or enable aggregator 320 as described in this disclosure. A given aggregator 320 may include some, all or more elements than those depicted in FIG. 4. For example, command module 410, location module 430, power module 440 or switch module 450 may separately or collectively represent a wide variety of logic device(s) or executable content to implement the features or elements of aggregator 320. Example logic devices may include one or more of a microprocessor, a microcontroller, a processor circuit, a field programmable gate array (FPGA), an application specific integrated circuit (ASIC), a sequestered thread or a core of a multi-core/multi-threaded microprocessor, or a combination thereof.

In some examples, command module 410 communicates with a manager computing device (e.g., manager computing device 340) to respond to commands received from the manager computing device. Command module 410 may include logic or features to implement received commands and/or forward at least some of the received commands to one or more network computing devices coupled to aggregator 320. Command module 410 may also include logic or features to gather operating information received from the one or more network computing devices and at least temporarily store the gathered operating information in database 410. Responsive to a received command (e.g., a query command) from the manager computing device, command module 410 may be capable of accessing database 420 and providing gathered operating information to the manager computing device.

According to some examples, database 420 may be arranged to at least temporarily store operation information gathered by command module 410. Database 420 may include various types of non-volatile memory and may include at least one or a combination of different types of storage devices. These different types of storage devices may include, but are not limited to, one or more of a magnetic disk drive, an optical disk drive, a tape drive, an internal storage device, an attached storage device, flash memory, battery backed-up SDRAM (synchronous DRAM), a network accessible storage device, and/or other types of non-volatile memory (e.g., phase change memory (PCM)).

In some examples, location module 430 may include logic or features capable of gathering location information to indicate the physical location of aggregator 320. Location module 430 may include location capabilities such as a global positioning system (GPS) receiver to determine a physical location of aggregator 320. Physical location information determined by location module 430 may be provided to command module 410 for possible storage in database 420. The physical location information may be later provided (e.g., by command module 410) to a manager computing device in response to a received query command.

According to some examples, power module 440 may include logic or features arranged to provide power to one or more network computing devices coupled to aggregator 320. For these examples, power module 440 may be capable of providing power through power ports 405-1 to 405-N when a power link coupled to a network computing device is connected to a power port from among power ports 405-1 to 405-N. The power provided may be sufficient to provide operational power to the network computing device. In some examples, power module 440 may be capable of changing a power state for the network computing device by cutting off power routed through the power port via which the power link to the network computing device is connected.

In some examples, switch module 450 may include logic or features arranged to route data and/or instructions to/from one or more network computing devices through communication ports 415-1 to 415-N when a communication link coupled to a network computing device is connected to a communication port from among communication ports 415-1 to 415-N. In some examples. Switch module 450 may be capable of supporting or implementing one or more communication industry standards or specifications to route data and/or instructions to include, but not limited to those associated with the Ethernet standard, the PoE+ standard or the IEEE 1901 specification.

According to some examples, power ports 405-1 to 405-N and communication ports 415-1 to 415-N may be combined to support a PoE+ or an IEEE 1901 configuration. For examples, a single PoE+ or IEEE 1901 cable may include both power links and communication links between aggregator 320 and a network computing device. So, for example, power port 405-1 and communication port 415-1 may be integrated such that the single PoE+ or IEEE 1901 cable may connect to these two ports and allow for both power and data to be routed to the network computing device.

Figure 5:
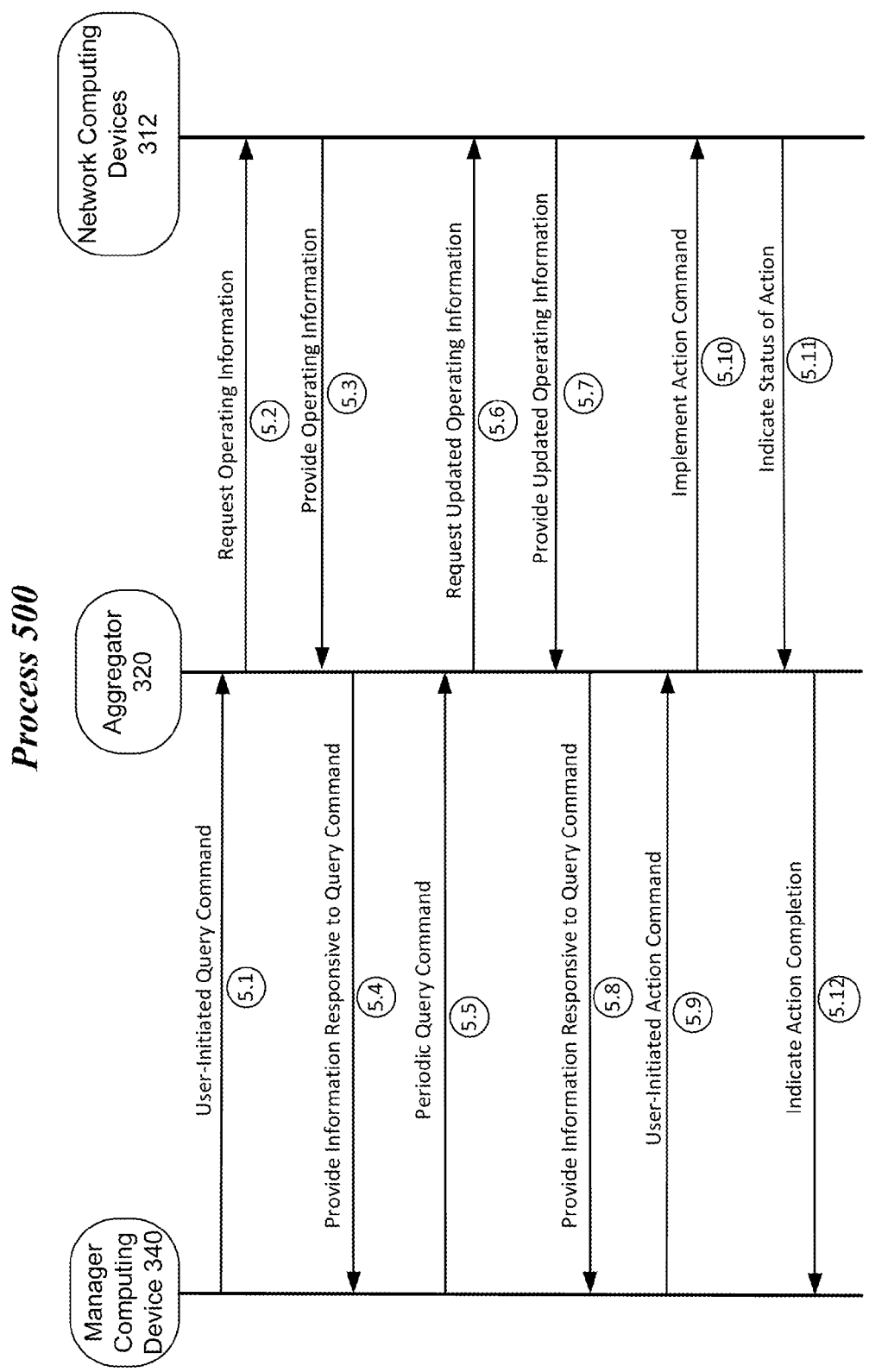
FIG. 5 illustrates a block diagram of an example process for managing an array of network computing devices.

FIG. 5 illustrates a block diagram of an example process for managing an array of network computing devices. In some examples, process 500 may be for managing an array of network computing devices 312 through aggregator 320 using manager computing device 340. For these examples, elements of systems 100, 200 or 300 as shown in FIGS. 1-3 or elements of aggregator 320 as shown in FIG. 4 may be used to illustrate example operations related to process 500. The described example operations are not limited to these elements as shown in FIGS. 1-4. Also, for these examples, network computing devices 320 may be arranged as servers that are separately housed in chassises mounted in a ceiling space or a floor space for one or more rooms.

Beginning at process 5.1 (User-Initiated Query Command), a user-interface included at manager computing device 340 may be capable of enabling a user to initiate a query command. In some examples, the query command may include a request for operating information for aggregator 320 and/or network computing devices 312. For these examples, the requested operating information for aggregator 320 and/or network computing device 312 may include an identification for aggregator 320 associated with a name or identifier via which the user or manager computing device 340 may uniquely identify aggregator 320. The operating information may also include a physical location of aggregator 320, separate media access control addresses for each network computing device from among network computing devices 312, power states/statuses for each network computing device or thermal characteristics for each network computing device. This disclosure is not limited to only the operating information listed above, but may include any type of operating information of possible use to manager computing device 340 or the user for managing or controlling aggregator 320 or network computing devices 312.

Proceeding to process 5.2 (Request Operating Information), logic and/or features at aggregator 320 (e.g., command module 410) may be capable of receiving the user-initiated query command. In some examples, these logic and/or features may forward at least a portion of the query command to network computing devices 312. The request for operating information may include at least some of the operating information mentioned above.

Proceeding to process 5.3 (Provide Operating Information), network computing devices 312 may include logic and/or features to respond to the request for operating information. In some examples, one or more network computing devices from among network computing devices 312 may provide operating information. For these examples, the operating information provided by the one or more network computing devices may include media access control addresses, power states/statuses or thermal characteristics. A network computing device providing power states/statuses may indicate whether the network computing device is in an idle, standby or in various operating power states. A network computing device providing thermal characteristics may provide sensor information obtained by one or more thermal sensors located at or with the network computing device.

Proceeding to process 5.4 (Provide Information Responsive to Query Command), logic and/or features at aggregator 320 (e.g., command module 410) may gather the operating information provided by network computing devices 312 and combine that operating information with operation information for aggregator 320 in order to provide information responsive to the query command. As shown in FIG. 5, that information may be provided to manager computing device 340.

Proceeding to process 5.5 (Periodic Query Command), manager computing device 340 may be capable of periodically sending query commands to aggregator 320. According to some examples, the periodic query command may be sent at regular intervals (e.g., every 1 minute) to aggregator 320. At least some of the operating information such as power states and thermal characteristics may be requested as part of the query command.

Proceeding to process 5.6 (Request Updated Operating Information), logic and/or features at aggregator 320 may receive the periodic query command and then forward at least a portion of the periodic query command to network computing devices 312 in a request for updated operating information. In some examples, the request for updated operating information may include a request for updated power states and/or updated thermal characteristics.

Proceeding to process 5.7 (Provide Updated Operating Information), network computing devices 312 may include logic and/or features to respond to the request for updated operating information. In some examples, one or more network computing devices from among network computing devices 312 may provide updated operating information to reflect current power states/statuses and/or thermal characteristics.

Proceeding to process 5.8 (Provide Information Responsive to Query Command), logic and/or features at aggregator 320 may gather the updated operating information provided by network computing devices 312 and combine that updated operating information with updated operation information for aggregator 320 in order to provide information responsive to the periodic query command. As shown in FIG. 5, that updated information may be provided to manager computing device 340.

Proceeding to process 5.9 (User-Initiated Action Command), a user-interface included at manager computing device 340 may be capable of enabling the user to initiate an action command. In some examples, the action command may modify one or more operating parameters for aggregator 320 and/or at least one network computing device from among network computing devices 312. For some examples, the one or more operating parameters may include a direction of airflow provided by one or more fans included in the chassises for at least some network computing devices 312. The action command to modify the direction of airflow may include directing the airflow either towards a room (see FIG. 2A) or away from the room (see FIG. 2B). For some examples, the one or more operating parameters may include powering on or off an LED array attached with a portion (e.g., a portion facing the floor of a room) of the chassises for at least some of network computing devices 312.

According to some examples, the one or operating parameters may be a power state. For some examples, the power state of one or more network computing devices 312 may be modified by aggregator 320 by merely cutting off or providing power to power links coupled between aggregator 320 and network computing devices 312 based on instructions included in the action command. For other examples, aggregator 320 may forward the action command to enable logic and/or features at one or more network computing devices of network computing devices 312 to modify their respective power states (e.g., power down, standby, idle, power reset, etc.).

Proceeding to process 5.10 (Implement Action Command), network computing devices 312 may implement the received action command. In some examples, as mentioned above, implementing the action command may include, but is not limited to, modifying the direction of air flow, powering LED arrays or implementing power states.

Proceeding to process 5.11 (Indicate Status of Action), logic and/or features at aggregator 320 may be capable of receiving a status of implementation of the action command. In some examples, the received status may indicate whether the operating parameters were either successfully or unsuccessfully modified or implemented. An indication that the operating parameters were not successful may cause aggregator 320 to initiate a hard reset of at least some network computing devices 312 by cutting power and then providing power again. The hard reset may occur due to an operating system for a network computing device becoming unresponsive or inoperable.

Proceeding to process 5.12 (Indicate Action Completion), logic and/or features at aggregator 320 may be arranged to send an indication of completion of the previously received action command to manager computing device 340. In some examples, the indication may be sent following receipt of the status of any action commands forwarded to network computing devices 312. The process may then return to either process 5.1, 5.5 or 5.9. As mentioned above, processes 5.5 and 5.9 may depend on user-initiated actions and process 5.5 may occur periodically.

FIG. 6 illustrates a logic flow 600 for receiving sensor information in accordance with one or more examples. Logic flow 600 may be performed by various systems and/or devices and may be implemented as hardware, software, and/or any combination thereof, as desired for a given set of design parameters or performance constraints. For example, the logic flow 600 may be implemented by a logic device (e.g., processor) and/or logic (e.g., instructions, data, and/or code) to be executed by a logic device. For purposes of illustration, and not limitation, the logic flow 600 is described with reference to FIGS. 1 and 2A-B.

According to some examples, logic flow 600 may receive sensor information from one or more sensors located with a network computing device housed in a chassis (e.g., mounted in a ceiling space or a floor space for a room) at block 602. For example, server 110 may include logic and/or features (e.g., located with or at network computing device 112) to receive the sensor information. The sensor information may have been obtained from various thermal or motion/light sensors located within or attached to outer portions of chassis 111 for server 110.

In some examples, logic flow 600 may adjust one or more fans housed in the chassis based on the received sensor information at blocks 604 and 606. For example, server 110 may include logic and/or features to adjust fans 115A and/or 115B to provide airflow in a first direction towards an area above chassis 111 or in a second direction away from the area above chassis 111. For these examples, the sensor information may include a comparison of a first temperature for the area above chassis 111 to a second temperature for the area below chassis 111. The one or more fans may be adjusted to provide airflow in the second direction based on the comparison indicating the first temperature is lower than the second temperature.

According to some examples, logic flow 600 may provide power to an LED array based on the received sensor information at blocks 608 and 610. For example, server 110 may include logic and/or features to provide power to LED array 118. For these examples, the sensor information may include motion sensor information or light sensor information. The power may be provided based on indications of movement in the room 130 and/or ambient light in room 130 being below a threshold level.

FIG. 7 illustrates a logic flow 700 for coupling an array of network computing devices in accordance with one or more examples. Logic flow 700 may be performed by various systems and/or devices and may be implemented as hardware, software, and/or any combination thereof, as desired for a given set of design parameters or performance constraints. For example, the logic flow 700 may be implemented by a logic device (e.g., processor) and/or logic (e.g., instructions, data, and/or code) to be executed by a logic device. For purposes of illustration, and not limitation, the logic flow 700 is described with reference to FIGS. 1-5.

According to some examples, logic flow 700 may couple an array of network computing devices separately housed in chassises mounted in a ceiling space or a floor space for one or more rooms at blocks 702 and 704. For example, aggregator 320 may couple to network computing devices 312-1 to 312-5 via C.L.s 322-1 to 322-5, respectively, as shown in FIG. 3.

In some examples, logic flow 700 may manage the array of network computing devices through the aggregator at blocks 704 and 708. For some examples, manager computing device 340 may be capable of including a user-interface to enable a user to manage or control one or more operations of aggregator 320 or network computing devices 312-1 to 312-5. For these examples, managing or controlling the one or more operations may include, but is not limited to, the various processes described for process 500 as shown in FIG. 5.

Figure 8:
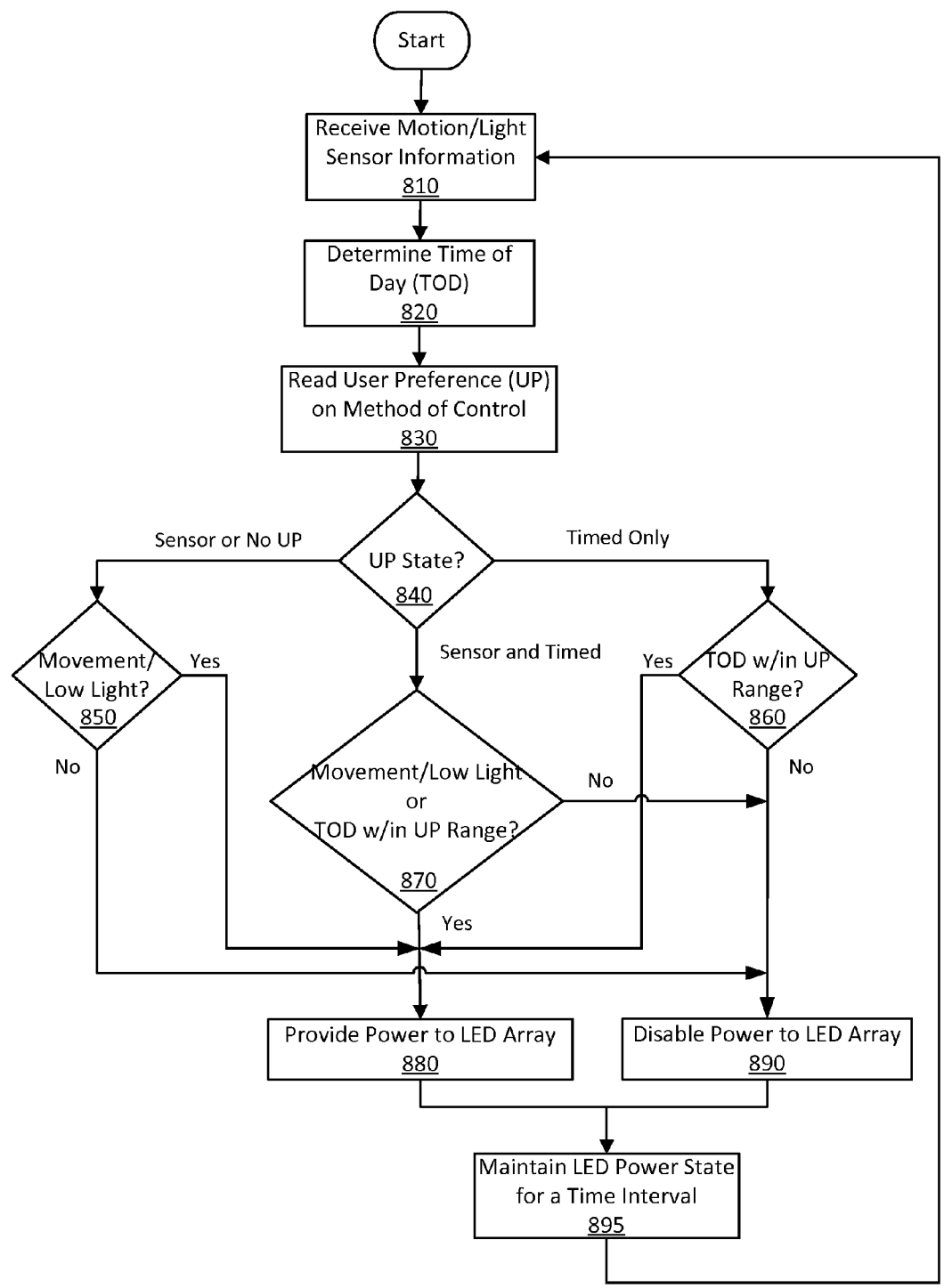
FIG. 8 illustrates an example flow diagram for providing power to a light emitting diode (LED) array.

FIG. 8 illustrates an example flow diagram for providing power to an LED array. In some examples, elements of systems 100, 200 or 300 as shown in FIGS. 1-3 may be used to illustrate example operations related to the flow chart depicted in FIG. 8. The described example operations are not limited to implementations on systems 100, 200 or 300 or to the elements describe therein for FIGS. 1-3.

Moving from the start to block 810 (Receive Motion/Light Sensor Information), server 110 may include logic and/or features configured to receive motion/light sensor information. In some examples, the motion/light sensor information may be received from motion/light sensor 116. For these examples, motion/light sensor 116 may be positioned or arranged on chassis 111 in such a manner as to sense motion and/or ambient light levels in room 130.

Proceeding from block 810 to block 820 (Determine Time of Day (TOD)), server 110 may include logic and/or features configured to determine a time of day. In some examples, the time of day may be determined by a clock maintained by or accessible to server 110. For these examples, the clock used to determine the time of day may be based on a geographic location of server 110, e.g., Pacific Time if located on the west coast of the United States.

Proceeding from block 820 to block 830 (Read User Preference (UP) on Method of Control), server 110 may include logic and/or features configured to receive an UP preference on a method of control. In some examples, the UP on method of control may have been received from an aggregator such as aggregator 320. For these examples, manager computing device such as manager computing device 340 may have forwarded the UP on method of control to aggregator 320 following a user indicating their preference for how LED array 118 may be powered. Aggregator 320 may have then forwarded the UP on method of control to server 110. Server 110 may then at least temporarily store the UP on method of control (e.g., in a memory maintained at or with network computing device 112).

Proceeding from block 830 to decision block 840 (UP State?), based on the UP state the process may move to decision blocks 850, 860 or 870. If there was no UP on method of control, the default is move the process to decision block 850. If the UP on method of control indicates timed only, the process moves to decision block 860. If the UP on method of control indicates sensor and timed, the process moves to decision block 870.

Moving from decision block 840 to decision block 850 (Movement/Low Light?), server 110 may include logic and/or features capable of determining whether the received motion/light sensor information indicates movement/low light. In some examples, sensed movement or light levels may be compared to threshold levels for movement or light levels. If the sensed movement or light levels exceed the threshold levels, the process moves to block 880. Otherwise, the process moves to block 890.

Moving from decision block 840 to decision block 860 (TOD w/in UP Range?), server 110 may include logic and/or features capable of determining whether a given time of day is within a range of times indicated in the UP on method of control. In some examples range may be associated with typical business operating hours such as 7 a.m. to 5 p.m. In other examples, the range may be associated with times of the day that people ordinarily occupy room 130. In yet other examples, the range may be based on typical daylight hours that may vary based on the time of year. If the time of day is within the range the process moves to block 880. Otherwise, the process moves to block 890.

Moving from decision block 840 to decision block 870 (Movement/Low Light or TOD w/in UP Range?), server 110 may include logic and/or features capable of determining whether the received motion/light sensor information indicates movement/low light or whether a given time of day is within a range of times indicated in the UP on method of control. In some examples, if the received sensor information indicates movement/low light or whether a given time of day is within a range of times the process moves to block 880. Otherwise, the process moves to block 890.

Moving from decision blocks 850, 860 or 870 to block 880 (Provide Power to LED Array), server 110 may provide power to LED array.

Moving from decision blocks 850, 860 or 870 to block 890 (Disable Power to LED Array), server 110 may either not power the LED array or disable power to the LED array if power was currently being provided.

Proceeding from either block 880 or block 890 to block 895 (Maintain LED Power State for a Time Interval), server 110 may include logic and/or features to maintain the LED power state established in blocks 880 or 890 for a time interval. In some examples, the time interval may depend on the manner of which the LED array was provided power. For example, if movement causes the LED array to be powered, the time interval may be several minutes. However, if time of day causes the LED array to be powered, the time interval may be as long as the amount of time of the range indicated in the UP state. Also, if the received sensor information or TOD causes the LED array to not be powered, the time interval may be relatively short, e.g., around one second. After the time interval has expired the process may move to block 810.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

In some examples, first methods may include receiving sensor information from one or more sensors located with a network computing device housed in a chassis. One or more fans housed in the chassis may be adjusted based on the received sensor information. The one or more fans may be adjusted to provide airflow in a first direction towards an area above the chassis or in a second direction away from the area above the chassis.

According to some examples for the first methods, the sensor information may include a comparison of a first temperature for the area above the chassis to a second temperature for the area below the chassis. The one or more fans may be adjusted to provide airflow in the second direction based on the comparison indicating the first temperature is lower than the second temperature.

In some examples, the chassis may be mounted in a ceiling space or a floor space for a room.

In some examples for the first methods, power may be provided to an LED array based on the received sensor information. The LED array may be attached with a portion of the chassis such that the powered LED array is capable of providing overhead lighting to the room when the chassis is mounted to the ceiling space above the room.

According to some examples for the first methods, the sensor information may include motion sensor information or light sensor information. Also, providing power to the LED array may include providing power based, at least in part, on the motion sensor information indicating movement in the room or based on the light sensor information indicating an ambient light level in the room has fallen below a threshold light level.

In some examples for the first methods, power may be provided to the LED array based on the received sensor information or based on a given time of day associated with a 24-hour time cycle.

In some examples for the first methods, the network computing device may be coupled with an aggregator that communicatively couples the network computing device and an array of other network computing devices with a manager computing device capable of controlling or managing one or more operations of the network computing device and the array of other network computing devices through the aggregator. The array of other network computing device may be housed in separate chassises mounted in the ceiling space or the floor space for the room.

According to some examples for the first methods, the one or more fans may be adjusted responsive to receiving an action command from the manager computing device. The action command to cause the one or more fans to provide airflow in the second direction.

According to some examples, a first apparatus or device may include a network computing device, one or more fans, a chassis to house the network computing device and the one or more fans. The first apparatus may also include one or more thermal sensors capable of sensing a first temperature for an area above the chassis and a second temperature for an area below the chassis. The one or more fans may be arranged to provide the airflow through the chassis in a direction based on a comparison of the first temperature to the second temperature.

In some examples for the first apparatus, the comparison of the first temperature to the second temperature may indicate the first temperature is lower than the second temperature. For these examples, the direction may include the one or more fans providing the airflow through the chassis away from the area above the chassis.

According to some examples for the first apparatus, the comparison of the first temperature to the second temperature may indicate the first temperature is higher than the second temperature. For these examples, the direction may include the one or more fans to provide the airflow through the chassis towards the area above the chassis.

In some examples for the first apparatus, the one or more thermal sensors may include a sensor located with the network computing device and housed in the chassis, The sensor may sense a third temperature for air located within the chassis. The one or more fans may be capable of being activated to provide airflow based on a comparison of the third temperature to a threshold temperature value.

According to some examples for the first apparatus, the chassis may include a mounting mechanism capable of mounting the chassis in a ceiling space or a floor space of a room.

According to some examples for the first apparatus, an LED array may be capable of attaching to a portion of the chassis such that responsive to receiving power, the LED array may be capable of providing overhead lighting to the room when the chassis is mounted to the ceiling space above the room.

In some examples for the first apparatus, the network computing device may be capable of coupling to an aggregator that communicatively couples the network computing device and an array of other network computing devices with a manager computing device capable of controlling or managing one or more operations of the network computing device and the array of other network computing devices.

According to some examples, second methods may include coupling an array of network computing devices separately housed in chassises mounted in a ceiling space or a floor space for one or more rooms. Coupling may include using an aggregator to route separate communication links between the aggregator and each network computing device of the array. For these examples, the array of network computing devices may be managed through the aggregator using a manager computing device capable of including a user-interface to enable a user to manage or control one or more operations of the aggregator or the array of network computing devices.

In some examples for the second methods, coupling may include using the aggregator to route separate power links to each network computing device of the array and powering the array of network devices through the separate power connections.

According to some examples for the second methods, managing or controlling through the aggregator may include the aggregator modifying a power state of a network computing device of the array of network computing device responsive to an action command received from the manager computing device.

In some examples for the second methods, managing or controlling through the aggregator may include the aggregator providing operating information for the aggregator and the array of network computing devices responsive to a query command received from the manager computing device.

According to some examples for the second methods, the operating information may include one or more of an aggregator identification, a physical location of the aggregator, separate media access control addresses for each network computing device of the array of network computing devices, power states for each network computing device of the array of network computing devices or thermal characteristics for each network computing device of the array of network computing devices.

In some examples for the second methods, managing or controlling through the aggregator may include the aggregator forwarding an action command initiated by the user or the manager computing device. The action command may modify one or more operating parameters for at least one network computing device of the array of network computing devices.

According to some examples for the second methods, the one or more operating parameters may include a direction of airflow provided by one or more fans included in the chassises for at least some of the network computing devices of the array of network computing devices, the direction of airflow to be adjusted towards the one or more rooms or away from the one or more rooms based on the action command.

In some examples for the second methods, the one or more operating parameters may include powering a light emitting diode (LED) array attached with a portion of the chassises for at least some of the network computing devices such that the powered LED array is capable of providing overhead lighting to the one or more rooms.

According to some examples, a second apparatus or device may include an aggregator capable of being configured to couple an array of network computing devices separately housed in chassises mounted in a ceiling space or a floor space for one or more rooms to a manager computing device. The aggregator may also be capable of being configured to communicate with the manager computing device to enable a user to manage or control one or more operations of the array of network computing devices.

According to some examples for the second apparatus, the aggregator may couple the array of network computing devices via separate communication links between the aggregator and each network computing device of the array.

In some examples for the second apparatus, the aggregator may be capable of being configured to route separate power links to each network computing device of the array. The aggregator may also be capable of being configured to provide power to the array of network devices through the separate power links.

According to some examples for the second apparatus, the aggregator may be capable of being configured to route separate communication and power links to each network computing device of the array, the separate communication and power links each routed via a single cable.

In some examples for the second apparatus, the single cable may be arranged to operate in compliance with an industry standard to include PoE+.

In some examples for the second apparatus, the aggregator may be capable of providing operating information for the array of network computing devices responsive to a query command received from the manager computing device.

According to some examples for the second apparatus, the operating information may include one or more of an aggregator identification, a physical location of the aggregator, separate media access control addresses for each network computing device of the array of network computing devices, power states for each network computing device of the array of network computing devices, thermal characteristics for each network computing device of the array of network computing devices.

In some examples for the second apparatus, the aggregator may be capable of being configured to implement or forward an action command initiated by the user or the manager computing device. The action command may modify one or more operating parameters for at least one network computing device of the array of network computing devices.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method comprising:
    receiving, at an aggregator, sensor information from one or more sensors located with a network computing device housed in a chassis mounted in a ceiling space above a ceiling for a room or in a floor space below a floor for the room, the one or more sensors including one or more thermal sensors capable of sensing a first temperature for an area above the chassis and a second temperature for an area below the chassis;
    adjusting one or more fans housed in the chassis based on the received sensor information including a comparison of a first temperature for the area above the chassis to a second temperature for an area below the chassis, the one or more fans adjusted to provide airflow in one of two directions including a first direction towards an area above the chassis and a second direction away from the area above the chassis, the one or two directions to enable the network computing device to provide heated air to the room; and
    gathering location information, the location information to indicate a physical location of the aggregator.

2. The method of claim 1, comprising the one or more fans adjusted to provide airflow in the second direction based on the comparison indicating the first temperature is lower than the second temperature.

3. The method of claim 1, comprising providing power to a light emitting diode (LED) array based on the received sensor information, the LED array attached with a portion of the chassis such that the powered LED array is capable of providing overhead lighting to the room when the chassis is mounted to the ceiling space.

4. The method of claim 3, the sensor information including motion sensor information or light sensor information, providing power to the LED array comprises providing power based, at least in part, on the motion sensor information indicating movement in the room or based on the light sensor information indicating an ambient light level in the room has fallen below a threshold light level.

5. The method of claim 3, comprising providing power to the LED array based on the received sensor information or based on a given time of day associated with a 24-hour time cycle.

6. The method of claim 1, the aggregator to communicatively couple the network computing device and an array of other network computing devices with a manager computing device capable of controlling or managing one or more operations of the network computing device and the array of other network computing devices through the aggregator, the array of other network computing device housed in separate chassises mounted in the ceiling space or the floor space of the room.

7. The method of claim 6, comprising adjusting the one or more fans in the one of two directions responsive to receiving an action command from the manager computing device, the action command to cause the one or more fans to provide airflow in the second direction.

8. An apparatus comprising:
    a network computing device;
    one or more fans;
    a chassis to house the network computing device and the one or more fans, the chassis including a mounting mechanism capable of mounting the chassis in a ceiling space above a ceiling for a room or in a floor space below a floor for the room;
    one or more thermal sensors capable of sensing a first temperature for an area above the chassis and a second temperature for an area below the chassis, the one or more fans arranged to provide the airflow through the chassis in one of two directions based on a comparison of the first temperature to the second temperature, the one or two directions to enable the network computing device to provide heated air to the room; and an aggregator to communicatively couple the network computing device to a network and gather location information, the location information to indicate a physical location of the aggregator.

9. The apparatus of claim 8, based on the comparison indicating the first temperature is lower than the second temperature, the one of two directions comprises the one or more fans to provide the airflow through the chassis away from the area above the chassis.

10. The apparatus of claim 9, based on the comparison indicating the first temperature is higher than the second temperature, the one of two directions comprises the one or more fans to provide the airflow through the chassis towards the area above the chassis.

11. The apparatus of claim 8, comprising the one or more thermal sensors including a sensor located with the network computing device and housed in the chassis, the sensor to sense a third temperature for air located within the chassis.

12. The apparatus of claim 11, comprising the one or more fans capable of being activated to provide airflow in the one of two directions based on a comparison of the third temperature to a threshold temperature value.

13. The apparatus of claim 8, comprising:
a light emitting diode (LED) array capable of attaching to a portion of the chassis such that responsive to receiving power, the LED array is capable of providing overhead lighting to the room when the chassis is mounted to the ceiling space above the room.

14. The apparatus of claim 8, the aggregator to communicatively couple the network computing device and an array of other network computing devices with a manager computing device capable of controlling or managing one or more operations of the network computing device and the array of other network computing devices.

15. A method comprising:
coupling an array of network computing devices separately housed in chassises mounted in a ceiling space above a ceiling for one or more rooms or a floor space below a floor for the one or more rooms, coupling to include using an aggregator to route separate communication links between the aggregator and each network computing device of the array;
gathering location information, the location information to indicate a physical location of the aggregator; and
managing the array of network computing devices through the aggregator using a manager computing device capable of including a user-interface to enable a user to manage or control one or more operations of the aggregator or the array of network computing devices, managing the array of network computing devices including the aggregator forwarding an action command initiated by the user or the manager computing device, the action command to modify one or more operating parameters for at least one network computing device of the array of network computing devices, the one or more operating parameters including one of two directions of airflow provided by one or more fans included in the chassises for at least some of the network computing devices of the array of network computing devices, the one of two directions of airflow including a first direction towards the one or more rooms and a second direction away from the one or more rooms, the one or two directions to enable the array of network computing devices to provide heated air to the one or more rooms.

16. The method of claim 15, comprising coupling to include using the aggregator to route separate power links to each network computing device of the array and powering the array of network devices through the separate power connections.

17. The method of claim 16, managing through the aggregator comprises the aggregator modifying a power state of a network computing device of the array of network computing device responsive to an action command received from the manager computing device.

18. The method of claim 15, managing through the aggregator comprises the aggregator providing operating information for the aggregator and the array of network computing devices responsive to a query command received from the manager computing device.

19. The method of claim 18, the operating information including one or more of an aggregator identification, the physical location of the aggregator, separate media access control addresses for each network computing device of the array of network computing devices, power states for each network computing device of the array of network computing devices or thermal characteristics for each network computing device of the array of network computing devices.

20. The method of claim 15, comprising the one or more operating parameters including powering a light emitting diode (LED) array attached with a portion of the chassises for at least some of the network computing devices such that the powered LED array is capable of providing lighting to the one or more rooms.

* * * * *